US007033862B2

(12) United States Patent
Chen

(10) Patent No.: US 7,033,862 B2
(45) Date of Patent: Apr. 25, 2006

(54) METHOD OF EMBEDDING SEMICONDUCTOR ELEMENT IN CARRIER AND EMBEDDED STRUCTURE THEREOF

(75) Inventor: Chi-Ming Chen, Hsin-chu (TW)

(73) Assignee: Phoenix Precision Technology Corporation, (TW)

( * ) Notice: Subject to any disclaimer, the term of this patent is extended or adjusted under 35 U.S.C. 154(b) by 0 days.

(21) Appl. No.: 11/009,012

(22) Filed: Dec. 13, 2004

(65) Prior Publication Data

US 2005/0285244 A1 Dec. 29, 2005

(30) Foreign Application Priority Data

Jun. 29, 2004 (TW) ............................... 93118985 A

(51) Int. Cl.
*H01L 21/50* (2006.01)

(52) U.S. Cl. ...................................................... 438/110

(58) Field of Classification Search ................ 438/106, 438/110, 112, 117, 118, 127
See application file for complete search history.

(56) References Cited

U.S. PATENT DOCUMENTS 5,646,316 A 7/1997 Jacobson et al.
6,194,250 B1 * 2/2001 Melton et al. .............. 438/126
6,486,537 B1 11/2002 Liebhard
6,515,356 B1 2/2003 Shin et al.
6,586,824 B1 7/2003 Glenn et al.
6,746,894 B1 * 6/2004 Fee et al. ................... 438/106
6,790,712 B1 * 9/2004 Bai ............................ 438/126
6,841,423 B1 * 1/2005 Farnworth .................. 438/127
6,858,473 B1 * 2/2005 Hosokawa et al. ......... 438/118

* cited by examiner

*Primary Examiner*—Scott Geyer
(74) *Attorney, Agent, or Firm*—William F. Nixon; Clark & Brody

(57) ABSTRACT

A method of embedding a semiconductor element in a carrier and an embedded structure thereof are proposed. First, a carrier having a hole is provided and an auxiliary material is attached to a side of the carrier. A semiconductor element is placed in the hole of the carrier. Then, a medium material and glue are applied in order in the hole to firmly position the semiconductor element in the hole of the carrier via the glue. Finally, the auxiliary material and the medium material are removed to form a structure with the semiconductor element being embedded in the carrier, thereby eliminating the drawbacks encountered in packing the semiconductor element in the prior art.

23 Claims, 6 Drawing Sheets

METHOD OF EMBEDDING SEMICONDUCTOR ELEMENT IN CARRIER AND EMBEDDED STRUCTURE THEREOF

FIELD OF THE INVENTION

The present invention relates to method of embedding semiconductor elements in carriers and embedded structures thereof, and more particularly, to a method of embedding a semiconductor chip in a hole of a carrier and a chip embedded structure.

BACKGROUND OF THE INVENTION

As the semiconductor packaging technology advances, there have been developed many different types of semiconductor packages. In general, a semiconductor package is formed by mounting a semiconductor chip on a substrate or lead frame, electrically connecting the chip to the substrate or lead frame, and then encapsulating the chip and the substrate or lead frame via a resin material. One of the advanced semiconductor packages is referred to as ball grid array (BGA) package, which is characterized in using a circuit board with the chip being mounted on a front surface thereof, and implanting a plurality of array-arranged solder balls on a back surface of the circuit board via a self-alignment technique. This arrangement allows more solder balls serving as I/O connections to be accommodated on a unit area of the circuit board acting as a chip carrier, which is desirable for a highly integrated semiconductor chip, and the solder balls serving as I/O connections are used to electrically connect the package to an external printed circuit board.

In a conventional BGA package, the chip is directly attached to a top surface of the substrate and the solder balls are mounted on a bottom surface of the substrate. This vertical stacking or mounting manner increases the overall height of the BGA package, making it hard to reduce the size or height of the package. To achieve the purpose of reducing the package height, there is provided a hole formed in the substrate, allowing the chip to be received in the hole and thus flush with the substrate. Related prior arts include U.S. Pat. Nos. 6,515,356, 6,486,537, 6,586,824 and 5,646,316.

Referring to FIG. 3A showing a cavity down BGA (CDBGA) semiconductor package disclosed in U.S. Pat. No. 6,515,356, this package comprises a substrate 21 formed with a hole 211; a semiconductor chip 22 mounted in the hole 211 and electrically connected to the substrate 21 via bonding wires 23; an encapsulation body 24 for filling the hole 211 and encapsulating the chip 22 and bonding wires 23; and a plurality of solder balls 25 mounted on a bottom surface of the substrate 21.

As shown in FIG. 3B, during the process for mounting the chip 22 in the hole 211 of the substrate 21, since the hole 211 penetrates the substrate 21, the substrate 21 is turned upside down to make its bottom surface (where the solder balls 25 are mounted) face upwards, and it is required to attach a tape 26 to a top surface (now facing downwards) opposite to the bottom surface to seal an opening of the hole 211, such that the chip 22 can be placed in the hole 211 and attached to the tape 26. Subsequently, further referring to FIG. 3A, the bonding wires 23 are formed to electrically connect the chip 22 to the substrate 21, the encapsulation body 24 is molded, and the solder balls 25 are implanted on the bottom surface (facing upwards) of the substrate 21. Finally, the whole structure is turned over to make the tape 26 face upwards, and the tape 26 is then removed. This completes fabrication of the CDBGA package having the chip 22 received in the hole 211 of the substrate 21, with active surfaces of the substrate 21 and the chip 22 where the bonding wires 23 are formed both facing downwards.

Referring to FIGS. 4A to 4C, a cavity up ball grid array (CUBGA) semiconductor package disclosed in U.S. Pat. No. 6,586,824 has a structure substantially similar to that of the foregoing CDBGA package. As shown in FIGS. 4A to 4C, the only difference is that in the CUBGA package, active surfaces of a substrate 31 and a chip 32 where bonding wires 33 are formed face upwards, and an encapsulation body 34 is formed at the top of the package. In general, the CUBGA package is formed by forming a hole 311 in the substrate 31; placing the chip 32 in the hole 311 and electrically connecting the chip 32 to the top active surface of the substrate 31 via bonding wires 33; forming an encapsulation body 34 to encapsulate the chip 32 and bonding wires 33; and then mounting a plurality of solder balls 35 on a bottom surface of the substrate 31.

Similarly since the hole 311 penetrates the substrate 31, it is required to use a tape 36 to seal the bottom of the hole 311, and then the chip 32 can be placed in the hole 311 and attached to the tape 36. After the bonding wires 33 are formed to electrically connect the chip 32 to the substrate 31 and the encapsulation body 34 is molded, the tape 36 is removed and finally the plurality of solder balls 35 are implanted on the bottom surface of the substrate 31. This thus completes fabrication of the CUBGA package.

The CUBGA package differs from the CDBGA package in that, the active surface of the chip 32 for electrical connection with the bonding wires 33 faces upwards, but the solder balls 35 for external electrical connection are mounted on a surface of the substrate 31 facing downwards. Compared to the CDBGA package, one drawback of the CUBGA package is that the substrate 31 must be turned over twice to complete the electrical connection. The CDBGA package and CUBGA package are common in that, before mounting the chip 22, 32, the tape 26, 36 is required to seal the hole 211, 311 of the substrate 21, 31 so as to allow the chip 22, 32 to be subsequently placed in the hole 211, 311 and positioned by the tape 26, 36, and then the encapsulation body 24, 34 is formed to hold the chip 22, 32 in place in the hole 211, 311.

However, since the chip 22, 32 is positioned and held in place by means of the tape 26, 36 and the encapsulation body 24, 34, the package cannot be subject to other connection manners such as stacking of multiple chips or stacking of multiple substrates, thereby reducing the flexibility in application of the packaged product.

Moreover, when the encapsulation body 24, 34 is applied for filling the hole 211, 311 of the substrate 21, 31 so as to fix the chip 22, 32 in place, since the tape 26, 36 is directly attached to the chip 22, 32 and partially exposed in the hole 211, 311, the tape 26, 36 may also be adhesive to the encapsulation body 24, 34 especially when being molten, thereby making it very difficult to completely remove the tape 26, 36 from the substrate 21,31, or leaving residues of the tape 26, 36 on the substrate 21,31 due to incomplete removal of the tape 26, 36. As a result, the appearance of the package is deteriorated.

In addition, further as to the chip 22, 32 being temporarily positioned by the tape 26, 36 in the hole 211, 311, since the contact area between the chip 22, 32 and the tape 26, 36 is substantially small, the positioning strength provided for the chip 22, 32 from the tape 26, 36 is not very strong, such that during subsequent wire-bonding or encapsulating process, the chip 22, 32 may be shifted in place or dislocated. This problem should be addressed and solved.

Furthermore, for a wire-bonded package or a flip-chip package that is employed frequently for the chip package now, the substrate fabricating process and the chip packaging process require different machines and procedures, making the fabrication processes of the package very complicated and costly. In particular for the wire-bonded package, the bonding wires are arranged in very high density around the chip, which would easily lead to contact between adjacent wires and cause short circuit, thereby increasing the difficulty in performing the wire-bonding process. Moreover, during a molding process for forming the encapsulation body, the substrate mounted with the chip and bonding wires is placed in a cavity of an encapsulating mold, allowing an epoxy material to be injected into the mold cavity to form the encapsulation body and encapsulate the chip and bonding wires. However, in practice, due to the various designs of semiconductor packages, the size of the mold cavity and clamping positions do not always match any particular semiconductor structure to be packaged, which may cause a problem of insufficient clamping and in such a case, the epoxy material would easily flash to the surface of the substrate. This not only affects the planarity and appearance of the semiconductor package, but may also contaminate the area on the substrate where the solder balls are to be implanted. As a result, the quality of electrical connection as well as the yield and reliability of the semiconductor package are seriously degraded.

Typically the fabrication processes of a semiconductor device starts from preparation of a suitable chip carrier via a chip carrier manufacturer (such as substrate or circuit board manufacturer) for the semiconductor device. Then, the chip carrier is transferred to a semiconductor packaging manufacturer to undergo subsequent die-bonding, molding, and ball implanting processes, etc., so as to produce the semiconductor device having electronic functions required by a client. Therefore, the fabrication processes of the semiconductor device involve a number of different manufacturers, including the chip carrier manufacturer and the semiconductor packaging manufacturer, thereby making the fabrication processes complicated in practice and not easy to achieve interface integration. In case the client wishes to modify the product design, the changes and integration involved are even more complicated, not meeting the requirements of flexibility in change and economical benefit.

SUMMARY OF THE INVENTION

A primary objective of the present invention is to provide a method of embedding a semiconductor element in a carrier and an embedded structure thereof, so as to effectively position the semiconductor element in the carrier.

Another objective of the invention is to provide a method of embedding a semiconductor element in a carrier and an embedded structure thereof, in which when the semiconductor element is placed in a hole of the carrier, a medium material is applied prior to glue in the hole to allow easy removal of an auxiliary material from the carrier.

Still another objective of the invention is to provide a method of embedding a semiconductor element in a carrier and an embedded structure thereof, in which when the semiconductor element is placed in a hole of the carrier, glue is applied in the hole to fix the semiconductor element in place in the hole.

A further objective of the invention is to provide a method of embedding a semiconductor element in a carrier and an embedded structure thereof, which can prevent the problems encountered in fabricating semiconductor packages in the prior art.

A further objective of the invention is to provide a method of embedding a semiconductor element in a carrier and an embedded structure thereof, which can reduce the overall height of the structure.

A further objective of the invention is to provide a method of embedding a semiconductor element in a carrier and an embedded structure thereof, so as to integrate a semiconductor chip and a chip carrier, thereby providing better flexibility in structure design for a client, and simplifying the fabrication processes, reducing the cost and solving the interface integration problem.

In order to achieve the foregoing and other objectives, the present invention proposes a method of embedding a semiconductor element in a carrier, comprising the steps of: preparing a carrier having at least one hole; attaching an auxiliary material to a side of the carrier; placing a semiconductor element such as semiconductor chip in the hole of the carrier; applying a medium material in a gap between the semiconductor element and the hole or to the bottom of the hole, and then applying glue in the gap between the semiconductor element and the hole so as to firmly position the semiconductor element in the hole via the glue; removing the auxiliary material using a physical or chemical process (such as heating or UV irradiation); and finally removing the medium material from the gap or the bottom of the hole using an acidic solvent, alkaline solution or hot water. Thus, the semiconductor element can be fixed in position in the hole of the carrier.

A surface of the auxiliary material attached to the carrier can be adhesive, slightly adhesive or non-adhesive. If the surface of the auxiliary material is adhesive or slightly adhesive, the semiconductor element can be temporarily adhered to the adhesive surface of the auxiliary material and then be fixed in position by the glue subsequently applied in the hole. If the surface of the auxiliary material is non-adhesive, the medium material having adhesion in a liquid phase is applied first in the hole, and then the semiconductor element is placed in the hole to be positioned by the medium material and fixed in place by the glue subsequently applied in the hole.

By the above method, the present invention discloses an embedded structure with a semiconductor element embedded in a carrier, comprising: a carrier having a hole; at least one semiconductor element mounted in the hole; and glue filled in a gap between the hole and the semiconductor element to firmly position the semiconductor element in the hole of the carrier.

In the present invention, a medium material is applied prior to glue to separate an auxiliary material from the glue such that the auxiliary material can be easily removed without being bound to the glue. Moreover, the semiconductor element can be firmly positioned in a hole of the carrier via the glue, thereby prevent the semiconductor element from dislocation in subsequent fabrication processes. Furthermore, by the present invention the semiconductor element can be embedded and received in the hole of the carrier, making the overall thickness or size of a fabricated semiconductor device desirably reduced as well as simplifying the semiconductor packaging processes. This thereby provides better flexibility in structure for a client, simplifies the fabrication processes for semiconductor manufacturers, and solves the interface integration problem of the semiconductor package.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

First Preferred Embodiment

FIGS. 1A to 1G show procedural steps of a method of embedding a semiconductor element in a carrier in accordance with a first preferred embodiment of the present invention.

Figure 1A:
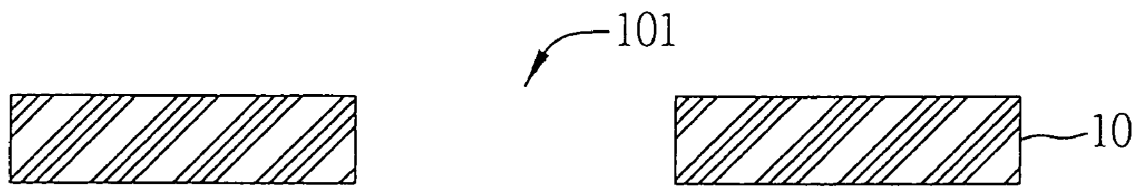
FIGS. 1A to 1G are schematic cross-sectional diagrams showing procedural steps of a method of embedding a semiconductor element in a carrier according to a preferred embodiment of the present invention.

Referring to FIG. 1A, first, a carrier 10 is prepared, which can be an insulating board, metal board, or circuit board having a circuit layer. At least one hole 101 is formed through the carrier 10.

Figure 1B:
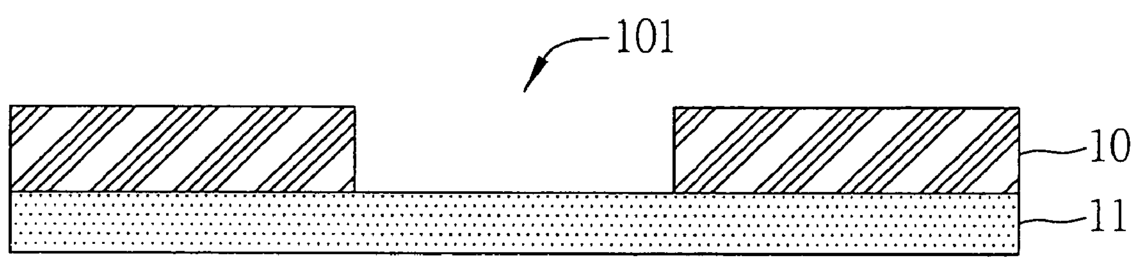

Referring to FIG. 1B, an auxiliary material 11 is attached to the bottom of the carrier 10 and temporarily seals a bottom opening of the hole 101 of the carrier 10. The auxiliary material 11 can be made as a film, dry film, insulating board or metal board, and a surface of the auxiliary material 11 in contact with the carrier 10 can be made adhesive or slightly adhesive.

Figure 1C:
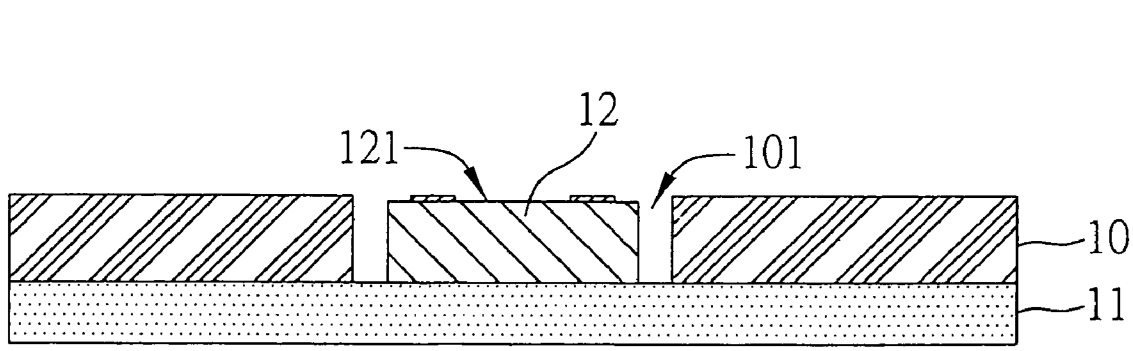

Referring to FIG. 1C, a semiconductor element 12 such as semiconductor chip is placed in the hole 101 of the carrier 10 in a manner that an active surface 121 of the semiconductor element 12 is exposed from the hole 101 and the semiconductor element 12 is positioned on the adhesive surface of the auxiliary material 11 in the hole 101.

Figure 1D:
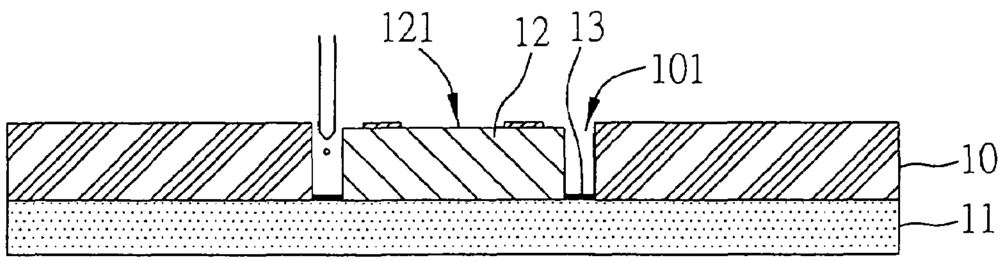

Referring to FIG. 1D, a medium material 13 such as wax or low viscous colloid is applied in a gap between the semiconductor element 12 and the hole 101 to form a ring-shaped membrane at the bottom of the hole 101.

Figure 1E:
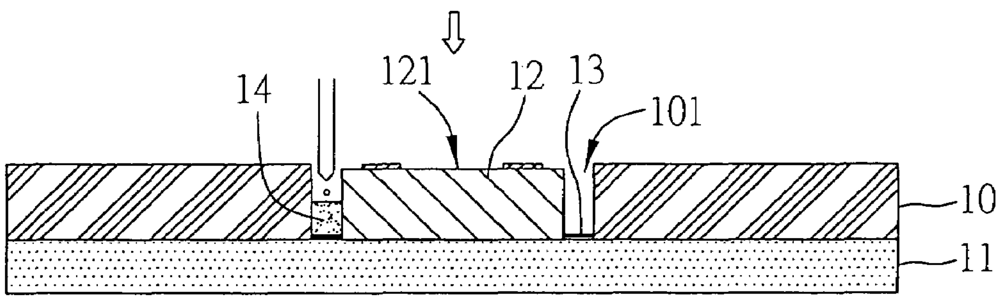

Then referring to FIG. 1E, glue 14 such as thermosetting adhesive, ABF(Ajinomoto build-up film) or PP(prepreg) is then applied in the gap between the semiconductor element 12 and the hole 101 to firmly hold the semiconductor element 12 in place in the hole 101 of the carrier 10.

Figure 1F:
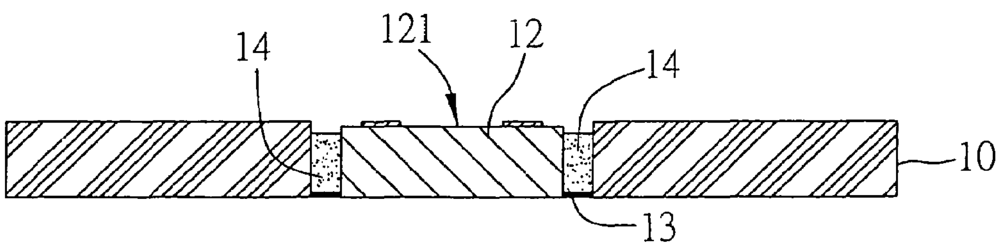

Referring to FIG. 1F, the adhesion of the auxiliary material 11 is destroyed by a physical or chemical process such as heating or UV (ultraviolet) irradiation, such that the auxiliary material 11 can be removed from the bottom of the carrier 10.

Figure 1G:
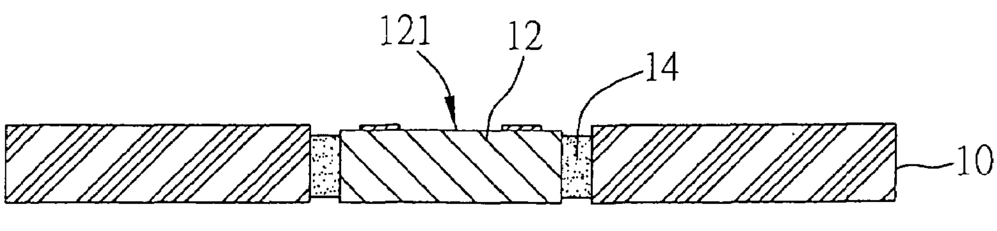

Referring to FIG. 1G, finally, an acidic solvent, alkaline solvent or hot water is used to remove the medium material 13 and any residue of the auxiliary material 11 on the carrier 10. As a result, the semiconductor element 12 is held in place and supported by the surrounding glue 14 in the hole 101 of the carrier 10.

In the foregoing method, after the semiconductor element 12 is embedded in the hole 101 of the carrier 10, it is fixed in place by the glue 14 without being dislocated or shifted in position, thereby making the structure well operative in subsequent fabrication processes. Moreover, a medium material 13 is applied prior to the glue 14, such that the auxiliary material 11 and the glue 14 are separated by the medium material 13 and can thus be prevented from being bound to each other. As a result, after the glue 14 is applied, the auxiliary material 11 can be successfully removed from the bottom of the carrier 10 by using UV irradiation or heating to destroy the adhesion of the auxiliary material 11.

Second Preferred Embodiment

FIGS. 2A to 2G show procedural steps of the method of embedding a semiconductor element in a carrier in accordance with a second preferred embodiment of the present invention. In this embodiment, an auxiliary material used is the same as that of the first embodiment with its surface being made adhesive, slightly adhesive or non-adhesive.

Figure 2A:
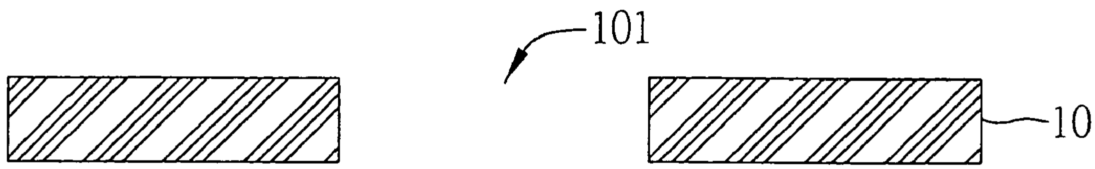
FIGS. 2A to 2G are schematic cross-sectional diagrams showing procedural steps of the method of embedding a semiconductor element in a carrier according to another preferred embodiment of the present invention.
Figure 2B:
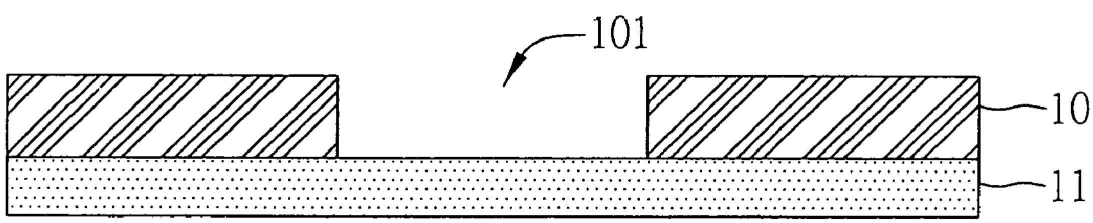

Referring to FIGS. 2A and 2B, first, a carrier 10 having a hole 101 is provided. A slightly adhesive auxiliary material 11 is attached to the bottom surface of the carrier 10 and temporarily seals a bottom opening of the hole 101 of the carrier 10.

Figure 2C:
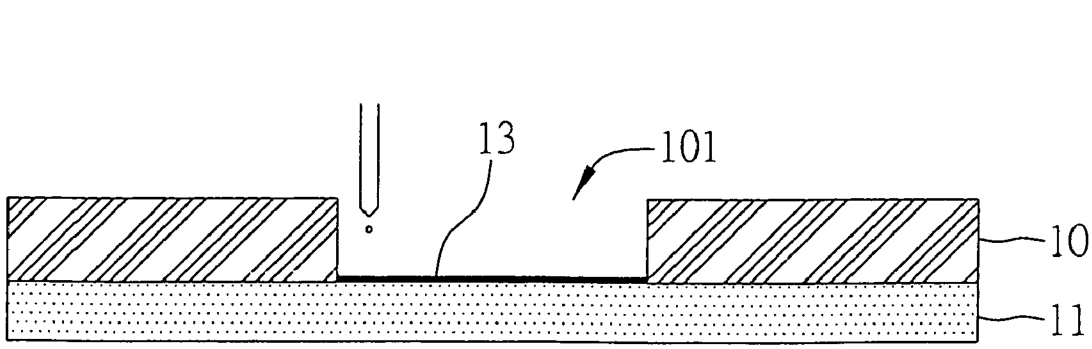

Referring to FIG. 2C, a medium material 13 is applied in the hole 101 to form a layer of medium material 13 at the bottom of the hole 101.

Figure 2D:
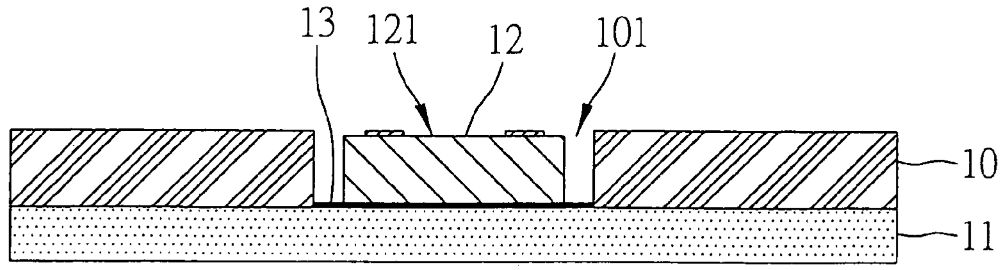

Referring to FIG. 2D, then a semiconductor element 12 is place in the hole 101 in a manner that an active surface 121 of the semiconductor element 12 is exposed from the hole 101. Since the medium material 13 when in a liquid phase before being cured has adhesion, the semiconductor element 12 thus can be positioned on the auxiliary material 11 via the adhesive medium material 13.

Figure 2E:
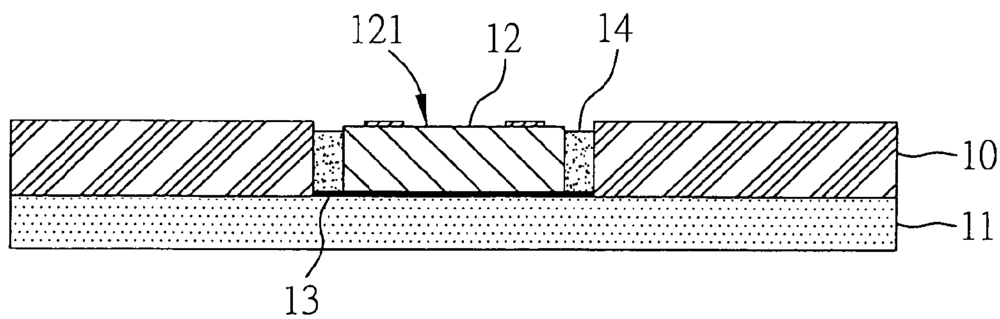

Referring to FIG. 2E, glue 14 is applied in a gap between the semiconductor element 12 and the hole 101 to firmly hold the semiconductor element 12 in place in the hole 101.

Figure 2F:
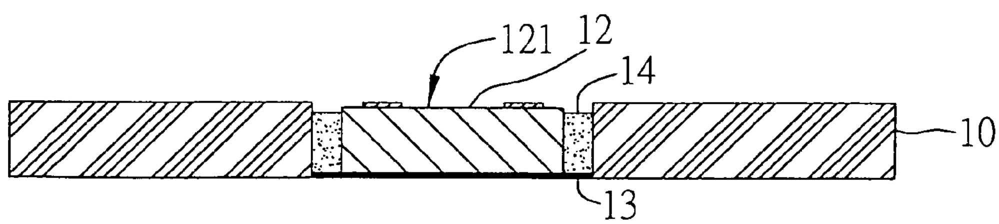
Figure 2G:
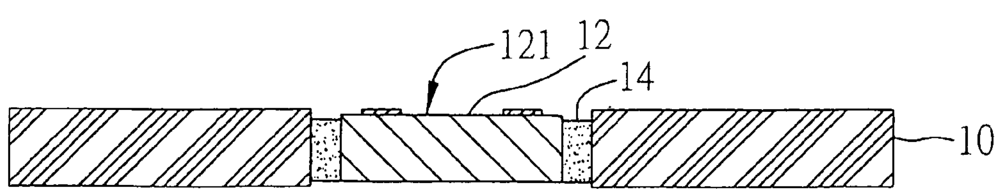
Figure 3A:
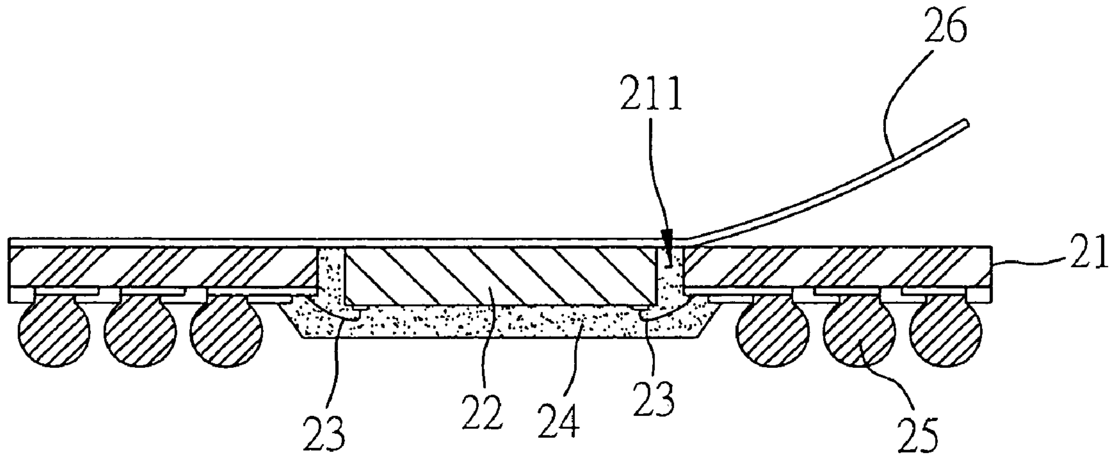
FIG. 3A (PRIOR ART) is a cross-sectional view of the semiconductor package at a stage when a tape is being removed from a substrate in accordance with U.S. Pat. No. 6,515,356.
Figure 3B:
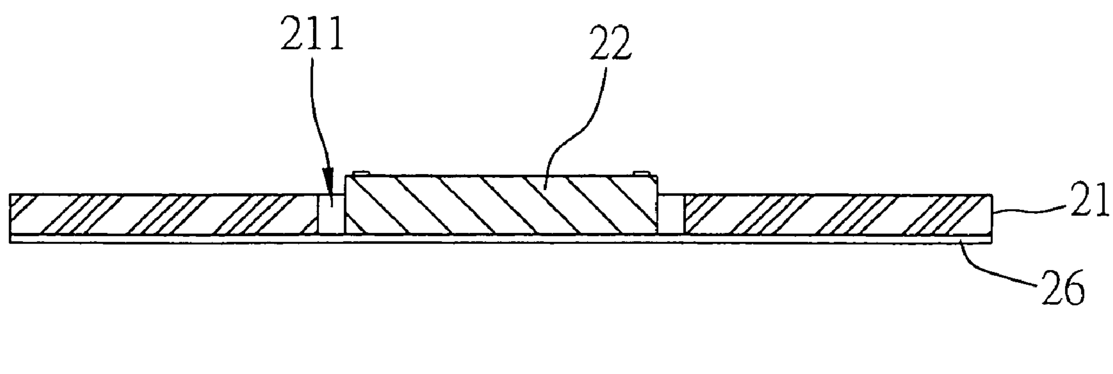
FIG. 3B (PRIOR ART) is a cross-sectional view of a semiconductor structure at a stage when a semiconductor chip is being mounted in a hole of the substrate in accordance with U.S. Pat. No. 6,515,356.
Figure 4A:
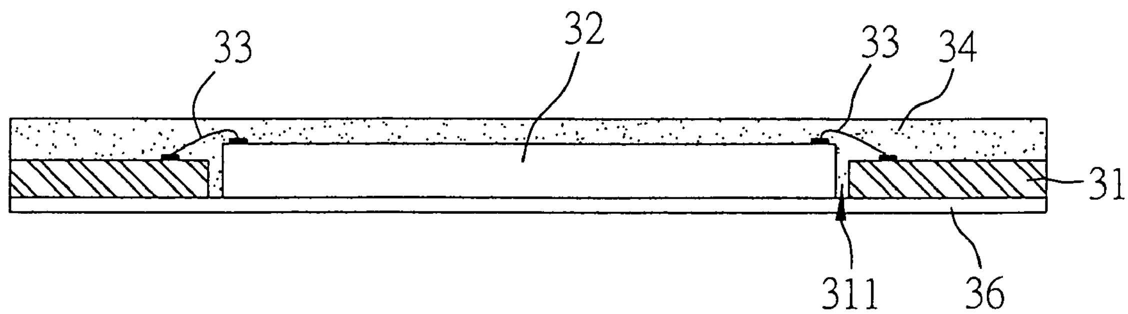
FIG. 4A (PRIOR ART) is a cross-sectional view of a semiconductor package in accordance with U.S. Pat. No. 6,586,824.
Figure 4B:
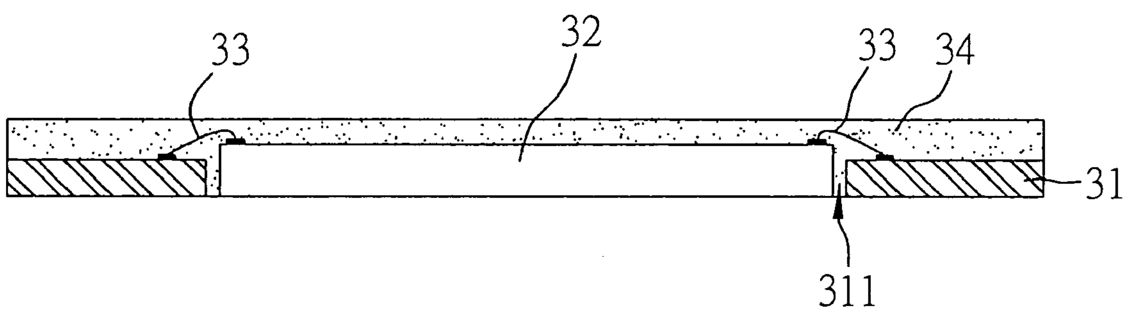
FIG. 4B (PRIOR ART) is a cross-sectional view of the semiconductor package with a tape being removed from a substrate in accordance with U.S. Pat. No. 6,586,824.
Figure 4C:
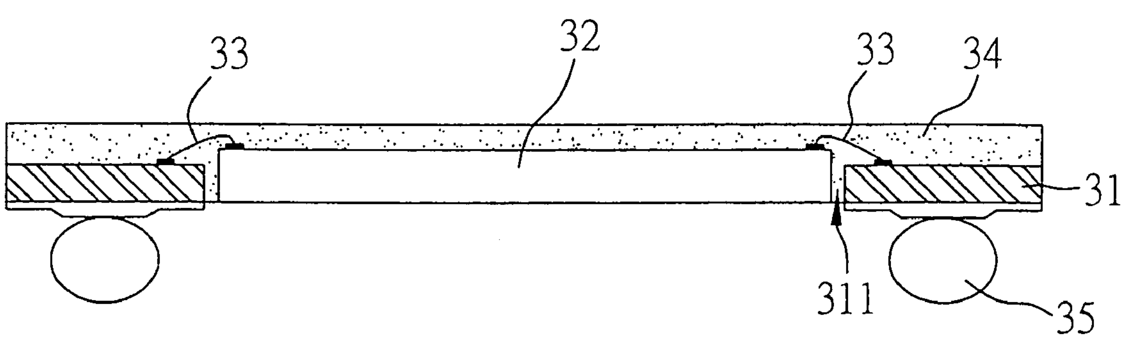
FIG. 4C (PRIOR ART) is a cross-sectional view of the fabricated semiconductor package in accordance with U.S. Pat. No. 6,586,824.

Referring to FIGS. 2F and 2G, the auxiliary material 11 is removed by a physical or chemical process (such as heating or UV irradiation). Finally, an acidic solvent, alkaline solvent or hot water is used to remove the medium material 13 and any residue of the auxiliary material 11 on the carrier 10. As a result, the semiconductor element 12 is firmly positioned in the hole 101 by the glue 14 and embedded in the carrier 10.

The above method is to use a medium material 13 when in a liquid phase before being cured to position the semiconductor element 12 on the auxiliary material 11. Then, after the auxiliary material 11 is removed, only the medium material 13 is left at the bottom of the hole 101 and can be removed by using an acidic solvent, alkaline solvent or hot water.

Further referring to FIGS. 1G and 2G, the present invention discloses an embedded structure with a semiconductor element being embedded in a carrier, which is fabricated by the above method and comprises: a carrier 10 having a hole 101; at least one semiconductor element 12 received in the hole 101; and glue 14 applied in a gap between the semiconductor element 12 and the hole 101, wherein a surface of the glue 14, which is located at the same side as an active surface of the semiconductor element 12, is lower in height than the active surface of the semiconductor element 12 and a surface of the carrier 10 located at the same side as the active surface of the semiconductor element 12, and the glue 14 can firmly position the semiconductor element 12 in the hole 121 of the carrier 101.

Therefore, the present invention provides a method of embedding a semiconductor element in a carrier and an embedded structure thereof, in which a medium material is applied prior to glue to separate an auxiliary material from the glue such that the auxiliary material can be easily removed without being bound to the glue. Moreover, the semiconductor element can be firmly positioned in a hole of the carrier via the glue, thereby prevent the semiconductor element from dislocation in subsequent fabrication processes. Furthermore, by the present invention the semiconductor element can be embedded and received in the hole of the carrier, making the overall thickness or size of a fabricated semiconductor device desirably reduced as well as simplifying the semiconductor packaging processes. This thereby provides better flexibility in structure for a client, simplifies the fabrication processes for semiconductor manufacturers, and solves the interface integration problem of the semiconductor package.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method of embedding a semiconductor element in a carrier, comprising the steps of:

preparing a carrier having at least one hole;

attaching an auxiliary material to a side of the carrier to seal an opening of the hole;

placing at least one semiconductor element in the hole of the carrier;

applying in order a medium material and glue in a gap between the semiconductor element and the hole so as to fix the semiconductor element in position in the hole of the carrier via the glue; and removing the auxiliary material and the medium material.

2. The method of claim 1, wherein the semiconductor element is a semiconductor chip.

3. The method of claim 1, wherein the carrier is one selected from the group consisting of an insulating board, metal board, and circuit board having a circuit layer.

4. The method of claim 1, wherein a surface of the auxiliary material attached to the carrier is one of adhesive, slightly adhesive, and non-adhesive.

5. The method of claim 1, wherein the auxiliary material is made as one selected from the group consisting of a film, dry film, insulating board, and metal board.

6. The method of claim 1, wherein the medium material is wax or low viscous colloid.

7. The method of claim 1, wherein the auxiliary material is removed by one of a physical technique and a chemical technique.

8. The method of claim 7, wherein the auxiliary material is removed by one of heating and UV (ultraviolet) irradiation.

9. The method of claim 1, wherein the medium material is removed by one of a solvent and hot water.

10. The method of claim 9, wherein the solvent is one of acidic and alkaline.

11. The method of claim 1, wherein the glue is one selected from the group consisting of a thermosetting adhesive, ABF, and PP.

12. A method of embedding a semiconductor element in a carrier, comprising the steps of:

preparing a carrier having at least one hole;

attaching an auxiliary material to a side of the carrier to seal an opening of the hole;

applying a medium material in the hole to form a layer of medium material on the auxiliary material at the sealed opening of the hole;

placing a semiconductor element in the hole of the carrier;

applying glue in a gap between the semiconductor element and the hole to fix the semiconductor element in position in the hole of the carrier; and removing the auxiliary material and the medium material.

13. The method of claim 12, wherein the semiconductor element is a semiconductor chip.

14. The method of claim 12, wherein the carrier is one selected from the group consisting of an insulating board, metal board, and circuit board.

15. The method of claim 12, wherein a surface of the auxiliary material attached to the carrier is one of adhesive, slightly adhesive, and non-adhesive.

16. The method of claim 12, wherein the auxiliary material is made as one selected from the group consisting of a film, dry film, insulating board, and metal board.

17. The method of claim 12, wherein the medium material is adhesive.

18. The method of claim 12, wherein the medium material is one selected from the group consisting of wax and low viscous colloid.

19. The method of claim 12, wherein the auxiliary material is removed by one of a physical technique and a chemical technique.

20. The method of claim 19, wherein the auxiliary material is removed by one of heating and UV irradiation.

21. The method of claim 12, wherein the medium material is removed by one of a solvent and hot water.

22. The method of claim 21, wherein the solvent is one of acidic and alkaline.

23. The method of claim 12, wherein the glue is one selected from the group consisting of a thermosetting adhesive, ABF, and PP.

* * * * *